(12) United States Patent
Shiozawa et al.

(10) Patent No.: US 7,679,127 B2
(45) Date of Patent: Mar. 16, 2010

(54) SEMICONDUCTOR DEVICE AND METHOD OF MANUFACTURING THE SAME

(75) Inventors: Junichi Shiozawa, Mie (JP); Takeo Furuhata, Mie (JP); Akiko Sekihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 11/769,304

(22) Filed: Jun. 27, 2007

(65) Prior Publication Data

US 2008/0121972 A1    May 29, 2008

(30) Foreign Application Priority Data

Jun. 27, 2006    (JP) .............................. 2006-176646

(51) Int. Cl.
*H01L 29/423* (2006.01)
*H01L 21/28* (2006.01)

(52) U.S. Cl. ............... 257/315; 257/316; 257/E29.129; 257/E21.179; 438/257; 438/593

(58) Field of Classification Search ................ 257/315, 257/316, E29.129, E21.179; 438/257, 593
See application file for complete search history.

(56) References Cited

U.S. PATENT DOCUMENTS

| | | | |
|---|---|---|---|
| 5,661,056 A | 8/1997 | Takeuchi | |
| 5,880,498 A | 3/1999 | Kinoshita et al. | |
| 6,642,570 B2 * | 11/2003 | Tseng | 257/315 |
| 6,891,222 B2 * | 5/2005 | Kim et al. | 257/324 |
| 6,893,918 B1 * | 5/2005 | Wang et al. | 438/257 |
| 6,902,976 B2 * | 6/2005 | Matsui et al. | 438/257 |
| 2006/0240619 A1 * | 10/2006 | Ozawa et al. | 438/257 |
| 2007/0026608 A1 * | 2/2007 | Choi et al. | 438/257 |
| 2007/0128797 A1 * | 6/2007 | Cho | 438/257 |

FOREIGN PATENT DOCUMENTS

| | | |
|---|---|---|
| JP | 9-219459 | 8/1997 |
| JP | 2005-26590 | 1/2005 |

* cited by examiner

*Primary Examiner*—Victor A Mandala
(74) *Attorney, Agent, or Firm*—Oblon, Spivak, McClelland, Maier & Neustadt, L.L.P.

(57) ABSTRACT

A semiconductor device including a semiconductor substrate; a first gate insulating film formed on the semiconductor substrate; a first gate electrode layer formed on the first gate insulating film; an element isolation insulating film formed so as to isolate a plurality of the first gate electrode layers; a second gate insulating film layer formed so as to cover upper surfaces of the plurality of first gate electrode layers and the element isolation insulating films; and a second gate electrode layer formed on the second gate insulating film layer; and the second gate insulating film layer includes a NONON stacked film structure and a nitride film layer contacting the first gate electrode layer and constituting a lowermost layer of the NONON stack film structure is separated at a portion interposing the plurality of neighboring first gate electrode layers.

9 Claims, 13 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2006-176646, filed on, Jun. 27, 2006 the entire contents of which are incorporated herein by reference.

FIELD

The present disclosure is directed to a semiconductor device employing a stacked gate structure and a method of manufacturing the same.

BACKGROUND

Conventionally, a stacked gate electrode structures composed of a floating gate electrode layer and a control gate electrode layer has been employed to render non-volatile storage of information. In realizing the stacked gate electrode structure, an inter-gate insulating film is formed between the floating gate electrode layer and the control gate electrode layer to provide insulation between the layers.

As a result of recent attempts in exploring gate insulating films exhibiting higher performance, ONO film (stack of silicon oxide film, silicon nitride film, and silicon oxide film) has been generally employed as the inter-gate insulating film. However, increasing integration of gate electrodes has given rise to occurrence of bird's beak in the ONO film and difficulties in achieving higher densification due to failure in obtaining the desired coupling ratio. As disclosed in JP H09-219459 A, it has beer considered to employ NONON stacked film structure (silicon nitride film/silicon oxide film/silicon nitride film/silicon oxide film/silicon nitride film) for the inter-gate insulating film. According to JP H09-219459 A, TDDB (Time Dependant Dielectric Break Down) can be reduced by a magnitude of approximately one digit as compared to conventional ONO film, thereby preventing the occurrence of bird's beak.

However, it has been observed that due to some unknown reason, employing NONON stacked film structure for inter-gate insulating film increases the occurrence of charge transportation between the neighboring floating gate electrodes when the state of charge accumulation between the neighboring floating gate electrode layers differ. Thus, when the charge accumulation between the floating electrode layers differ, charge transportation may undesirably lead to problems such as change in threshold voltage and data error.

SUMMARY

The present disclosure provides a semiconductor device that prevents charge transportation between the neighboring floating gate electrode layers when NONON stacked film structure is employed for inter-gate insulating film which is formed between the floating gate electrode layer and the control gate electrode layer. The present disclosure also provides a method of manufacturing such semiconductor device.

In one aspect, the present disclosure provides a semiconductor substrate including a first upper surface having an element isolation region and an element forming region; a first gate electrode formed on the first upper surface of the semiconductor substrate via a first insulating film in the element forming region, including a second upper surface being higher than the first upper surface of the semiconductor substrate and a first side surface; a second insulating film formed in the element isolation region of the semiconductor substrate, including a third upper surface being lower than the second upper surface and being higher than the first upper surface and a second side surface contacting with the first side surface; a third insulating film including a first portion formed on the second upper surface and the first side surface of the first gate electrode and a second portion formed on the third upper surface of the second insulating film; and a second gate electrode formed on the third insulating film, wherein the first portion of the third insulating film includes a first silicon nitride layer contacting with the first gate electrode, a first silicon oxide layer formed on the first silicon nitride layer, a second silicon nitride layer formed on the first silicon oxide layer, a second silicon oxide layer formed on the second silicon nitride layer and a third silicon nitride layer formed on the second silicon oxide layer, and the second portion of the third insulating film includes a third silicon oxide layer contacting with the third upper surface of the second insulating film, a fourth silicon nitride layer formed on the third silicon oxide layer, a fourth silicon oxide layer formed on the fourth silicon nitride layer and fifth silicon nitride layer formed on the fourth silicon oxide layer.

In another aspect, the present disclosure provides a semiconductor device including a semiconductor substrate; a first gate insulating film formed on the semiconductor substrate; a first gate electrode layer formed on the first gate insulating film; an element isolation insulating film formed so as to isolate a plurality of the first gate electrode layers; a second gate insulating film layer formed so as to cover upper surfaces of the plurality of first gate electrode layers and the element isolation insulating film; and a second gate electrode layer formed on the second gate insulating film layer; and the second gate insulating film layer includes a NONON stacked film structure and a nitride film layer contacting the first gate electrode layer and situated at a lowermost layer of the NONON stack film structure is separated at a portion interposing the plurality of neighboring first gate electrode layers.

Yet, in another aspect, the present disclosure provides a method of manufacturing the semiconductor device involving forming a first gate insulating film and a first conductive layer on a semiconductor substrate; separating the first conductive layer into plurality of portions by forming an element isolation trench in the first conductive layer, the first gate insulating film and the semiconductor substrate; forming an element isolation insulating film in the element isolation trench so as to define an exposed surface on at least a portion of the first conductive layer; selectively forming a nitride film layer constituting a lowermost layer of a second gate insulating film layer on the exposed surface of the first conductive layer; and forming an oxide film layer constituting the second gate insulating film layer on the nitride film layer and the element isolation insulating film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment applying the semiconductor device of the present disclosure to a NAND flash memory device (non-volatile semiconductor storage device) will be described with reference to FIGS. 1 to 13.

Figure 1:
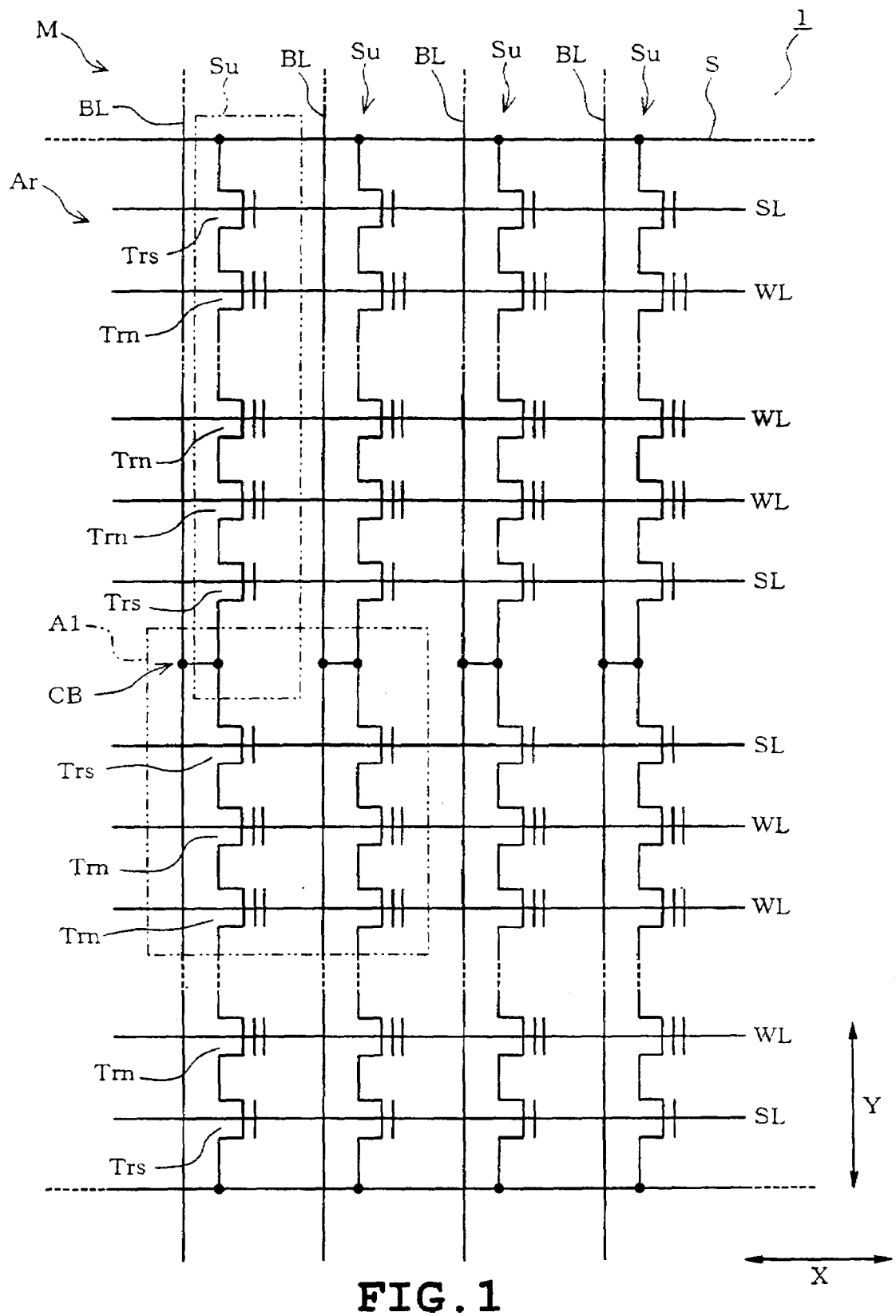
FIG. 1 is a diagram of an electrical configuration illustrating a portion of an inner configuration of a semiconductor device in accordance with one embodiment of the present disclosure.
Figure 2:
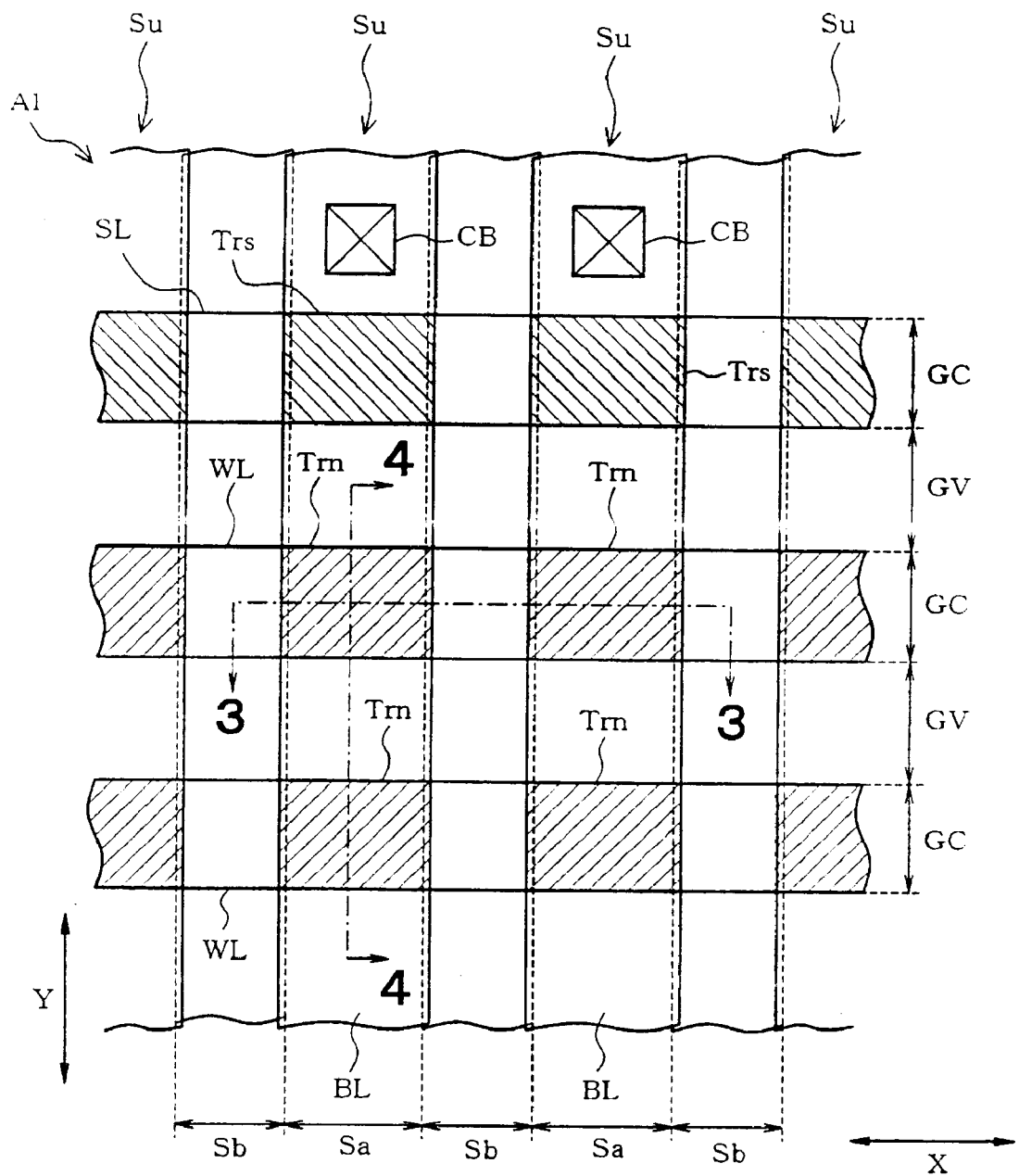
FIG. 2 is a schematic plan view of a structure of region A1 in FIG. 1.
Figure 3:
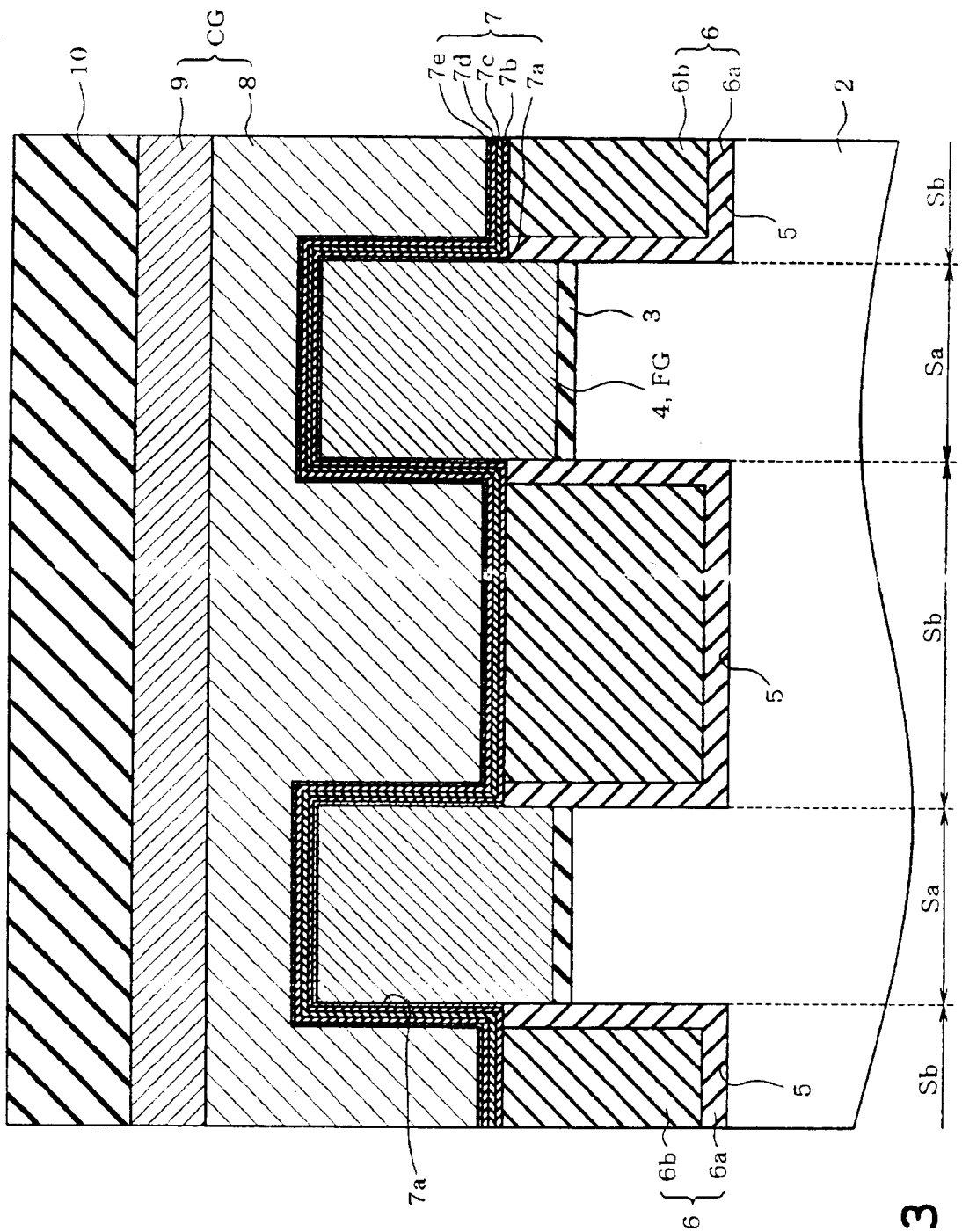
FIG. 3 is a sectional view taken along line 3-3 of FIG. 2.
Figure 4:
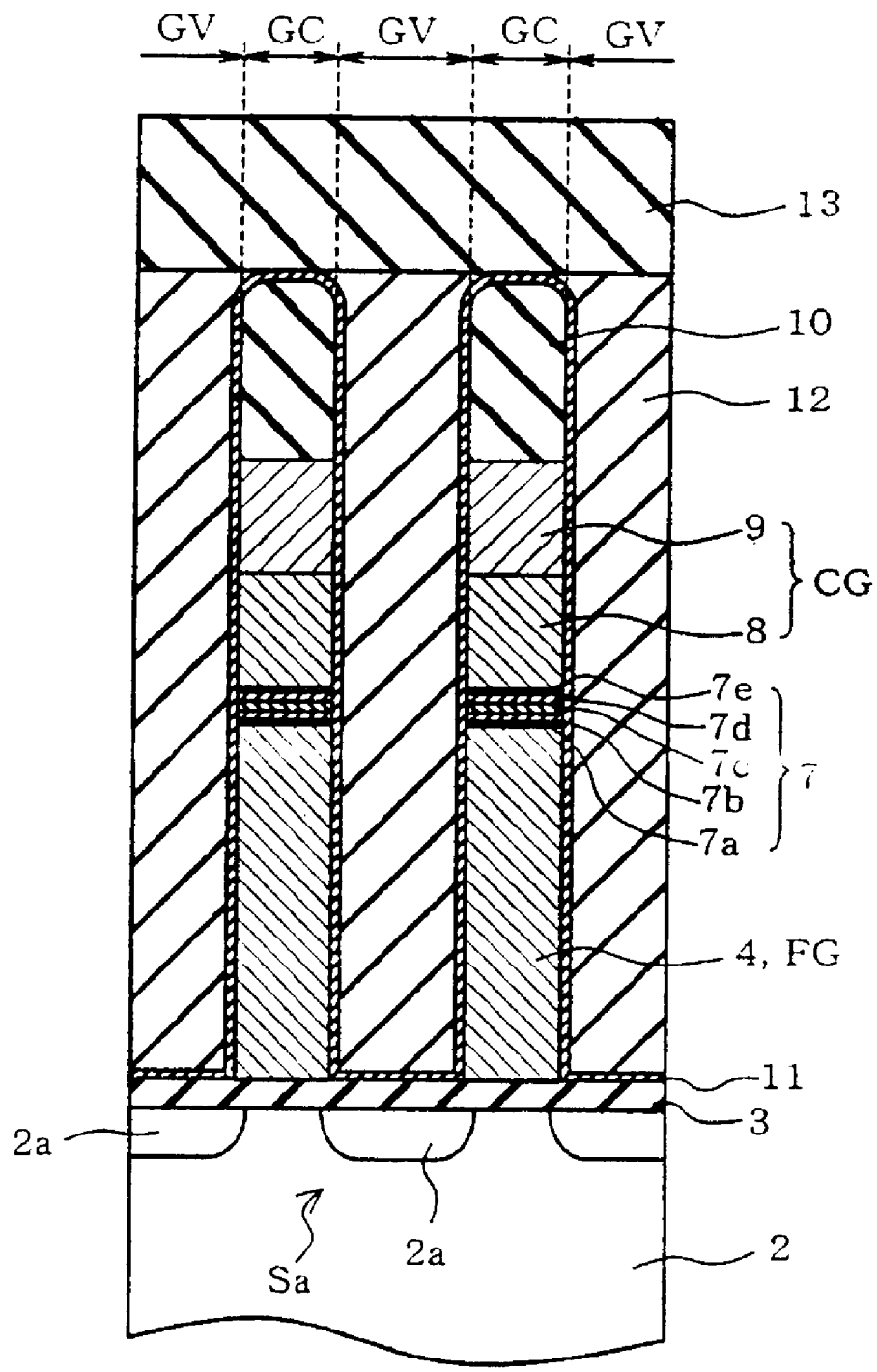
FIG. 4 is a sectional view taken along line 4-4 of FIG. 2.

FIG. 1 illustrates an equivalent circuit of a memory cell array constituting a NAND flash memory device. FIG. 2 is a schematic plan view of the memory cell configuration of region A1 (bit line contact CB, memory cell transistor Trn and select gate transistor Trs) of FIG. 1. FIG. 3 is a schematic sectional view taken along line 3-3 of FIG. 2. More specifically, FIG. 3 is a sectional view taken along the X-direction of a gate electrode of the memory transistor Trn and the silicon substrate 2. FIG. 4 is a schematic sectional view taken along line 4-4 of FIG. 2. More specifically, FIG. 4 is a sectional view taken along the Y-direction of the gate electrode of memory transistor Trn, and the silicon substrate 2.

The NAND flash memory device 1, serving as a semiconductor device has formed thereto a compartment of memory cell region M and peripheral circuit region (not shown) on a p-type semiconductor substrate 2.

Referring to FIG. 1, memory cell array Ar comprises NAND cell units SU arranged in an array of rows and columns. The NAND cell unit SU is constituted by a couple of select gate transistors Trs and a plurality (eight for example: nth power of 2 (n is a positive integer)) of memory cell transistors Trn disposed between the couple of select gate transistors Trs. The memory cell transistors Trn are connected in series by sharing the source/drain region 2a (refer to FIG. 4) between the neighboring memory cell transistors Trn.

Referring to FIG. 1, the memory cell transistors Trn aligned in the X-direction (word line direction) are connected to a common word line (control gate line) WL. Also, the select gate transistors Trs aligned in the X-direction are connected to a common select gate line SL.

The select gate transistors Trs are further connected to a bit line BL, extending in the Y-direction (bit line direction) perpendicular to the X-direction in FIG. 1, via a bit line contact CB.

Referring to FIG. 2, the plurality of NAND cell units SU are separated from one another by element isolation regions Sb taking an STI (Shallow Trench Isolation) structure. The memory cell transistors Trn are formed at intersections of element forming regions (active area) Sa extending in the Y-direction and the word lines WL formed at predetermined intervals in the Y-direction and extending in the X-direction.

The gate electrode structure of the memory cell region M constituting the features of the present embodiment will be described with reference to FIGS. 3 and 4.

Referring to FIG. 3, the element forming regions Sa are isolated and insulated from one another by element isolation regions Sb taking an STI structure. A silicon oxide film 3 is formed on each element forming region Sa. The silicon oxide film 3 serves as a first gate insulating film (corresponding to a gate oxide film, a tunnel insulating film, and a first insulating film).

A floating gate electrode layer FG serving as a first gate electrode layer is formed on each of the plurality of silicon oxide films 3. An upper surface of the floating gate electrode layer FG is higher than the upper surface of the silicon substrate 2. The floating gate electrode layer FG is configured by a first conductive layer, for example, amorphous silicon layer (polycrystalline silicon layer) 4. The amorphous silicon layer 4 is configured by an upper layer and a lower layer: non-dope amorphous silicon formed in the lower layer and amorphous silicon doped with impurities such as phosphorous formed in the upper layer. The amorphous silicon layer 4 is turned into polycrystalline silicon layer by thermal processing.

The element isolation region Sb electrically isolates the neighboring floating gate electrode layers FG. In the element isolation region Sb, an element isolation trench 5 is defined in the silicon substrate 2, and the element isolation trench 5 is filled with an element isolation insulating film 6. The lower portion of the element isolation insulating film 6 is composed of silicon oxide film 6a such as TEOS (Tetra Ethyl Ortho Silicate: Tetra EthOxy Silane), which silicon oxide film 6a is formed on the inner bottom surface of the element isolation trench 5.

Coated insulating film (spin on glass film) 6b made of polysilazane solution composed of silica-based coating solution is formed on the silicon oxide film 6a. Continuous shrinking of circuit design rule requires scaling of element isolation region Sb width. Thus, the present embodiment employs coated insulating film 6b exhibiting high-suitability for filling the element isolation trench 5 and the silicon oxide film 6a as element isolation insulating film 6 to render a double layer structure.

The element isolation insulating film (a second insulating film) 6 is formed so that the upper surface thereof is higher than the upper surface of the silicon oxide film 3 formed at both sides of the element isolation insulating film 6 and lower than the upper surface of the floating gate electrode layer FG. In other words, the element isolation insulating film 6 is formed so as to project from the silicon substrate 2 surface and separate the neighboring floating gate electrode layers FG. The side surfaces of the element isolation insulating film 6 contact the side surfaces of the neighboring floating gate electrode layers FG.

A second gate insulating film layer (corresponding to a third insulating film) 7 is configured to cover the floating gate electrode layer FG and the element isolation insulating film 6. A control gate electrode layer CG is formed on the second gate insulating film layer 7 so as to cover the second gate insulating film layer 7. The second gate insulating film layer 7 is formed on the upper surface and the side surfaces of the floating gate electrode layer FG.

The second gate insulating film layer 7 takes a stacked structure of a plurality of insulating films including the NONON stack film structure, and is formed between the floating gate electrode layer FG and the control gate electrode layer CG. The second gate insulating film layer 7 functions as an inter-gate insulating film (inter-poly insulating film) in the regions interposing the electrode layers FG and CG (corresponding to a first portion of the second gate insulating film layer 7); and takes a NONON structure composed of: the lowermost silicon nitride film 7a (nitride film layer), silicon oxide film 7b (oxide film layer), silicon nitride film 7c (nitride film layer), silicon oxide film 7d (oxide film layer) and the uppermost silicon nitride film 7e (nitride film layer).

The second gate insulating film layer 7 is also formed on the element isolation insulating film 6 where in such area (portion), at least a portion (for example central portion of element isolation insulating film 6) of the second gate insulating film layer 7 takes an ONON structure. In other words, in such area (corresponding to a second portion), the lowermost silicon nitride film 7a (nitride film layer) is removed as opposed to the region interposing the floating gate electrode layer FG and the control gate electrode layer CG (portion functioning as inter-gate insulating film), exhibiting a structure in which the silicon nitride film 7a is separated at a portion interposing the neighboring floating gate electrodes FG.

Each of the aforementioned films 7b to 7e constituting the second gate insulating film layer 7 is formed continuously from the area interposing the floating gate electrode FG and the control gate electrode CG (corresponding to the first portion of the second gate insulating film layer 7) to the area over the element isolation insulating film 6 (corresponding to the second portion of the second gate insulating film layer 7).

The inventors having verified that charge is prone to transport through the lower layers of the NONON structure, especially through the interface of the silicon nitride film 7a and the element isolation insulating film 6, have therefore opted to employ the aforementioned structure. Thus, charge transportation between the neighboring floating gate electrodes FG can be prevented. In the light of preventing charge transportation, the silicon oxide film 7b may be formed across the entire upper surface of the element isolation insulating film 6.

Suppose the thicknesses of the films are configured as follows: silicon nitride film 7a at 1 [nm], silicon oxide film 7b at 6 [nm], silicon nitride film 7c at 5 [nm], silicon oxide film 7d at 5 [nm] and silicon nitride film 7e at 1 [nm]. In such case, it is desirable to configure the thickness of the silicon oxide film 7b overlying the element isolation insulating film 6 to be thicker as compared with the silicon nitride film 7a, 7c, and 7d. This is in view of also preventing the charge transportation between the neighboring floating gate electrode layers FG in the lateral direction (X-direction) through silicon nitride film 7c by forming the silicon oxide film 7b thicker than the silicon nitride film 7c in particular.

The control gate electrode layer CG includes a polycrystalline silicon layer 8 (second conductive layer) doped with impurities such as phosphorous or arsenic and a tungsten silicide layer 9 functioning as a metal silicide layer for reducing resistance formed on the polycrystalline silicon layer 8. The control gate layer CG is formed over and across the plurality of element forming regions Sa and the element isolation regions Sb. A silicon nitride film 10 is formed on the control gate electrode layer CG.

As shown in FIG. 4, a protective silicon oxide film 11 is formed on the silicon nitride film 10 so as to cover the layers 4 to 10. An interlayer insulating film composed of silicon oxide films 12 and 13 are further formed on the silicon nitride film 10. A bit line BL (not shown in FIGS. 3 and 4) is formed on the silicon oxide films 12 and 13.

According to the configuration of the present embodiment, the second gate insulating film layer 7 takes a NONON stacked film structure and the silicon nitride film 7a situated in the lowermost layer of the structure is formed in the portion in contact with the floating gate electrode 4 but is separated in the portions interposing the plurality of neighboring floating gate electrodes FG. Thus, charge transportation through silicon nitride film 7a and charge transportation between the neighboring floating gate electrode layers FG can be prevented even if NONON stacked film structure is employed for inter-gate insulating film.

Since the silicon oxide film 7b is formed substantially across the entire surface of the element isolation insulating film 6, characteristic degradation caused by charge transportation through silicon nitride film 7a can be prevented. Also, since the thickness of the silicon oxide film 7b situated in the lowermost layer of the ONON stacked film structure formed on the element isolation insulating film 6 is made thicker than the silicon nitride film 7c in particular, charge transportation induced by the silicon nitride film 7c formed immediately on the silicon oxide film 7b can be prevented.

The method of manufacturing the memory cell region M of the NAND flash memory device 1 will be described in detail hereinafter. The method employs a process where the floating gate electrode layer FG is formed prior to the element isolation region Sb. The steps of the manufacturing process described hereinafter may be omitted or modified or may further incorporate additional well known step(s) as long as the present disclosure can be realized.

Figure 5:
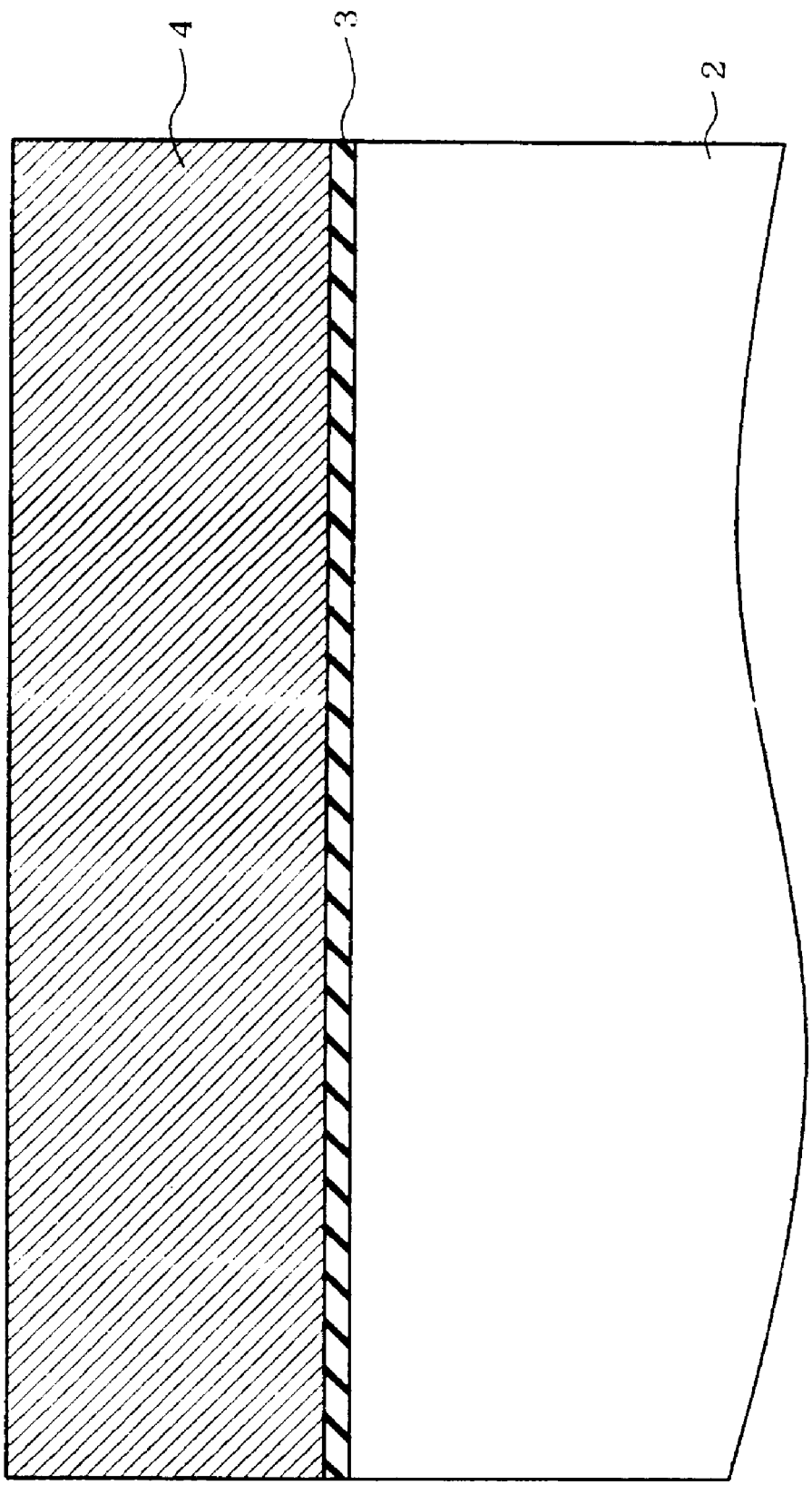
FIGS. 5 to 13 are views illustrating the manufacturing process.

Referring to FIG. 5, the silicon oxide film 3 serving as a first gate insulating film is formed on the silicon substrate 2 in the thickness of 10 [nm], for example by thermal oxidation process. Amorphous silicon layer 4 constituted by stacking ron-doped amorphous silicon and doped amorphous silicon doped with impurities such as phosphorous is formed on the silicon oxide film 3 by LPCVD (Low-Pressure Chemical Vapor Deposition) process in the thickness of 140 [nm], for example. The amorphous silicon layer 4 is converted to polycrystalline silicon layer by thermal processing step later on.

Figure 6:
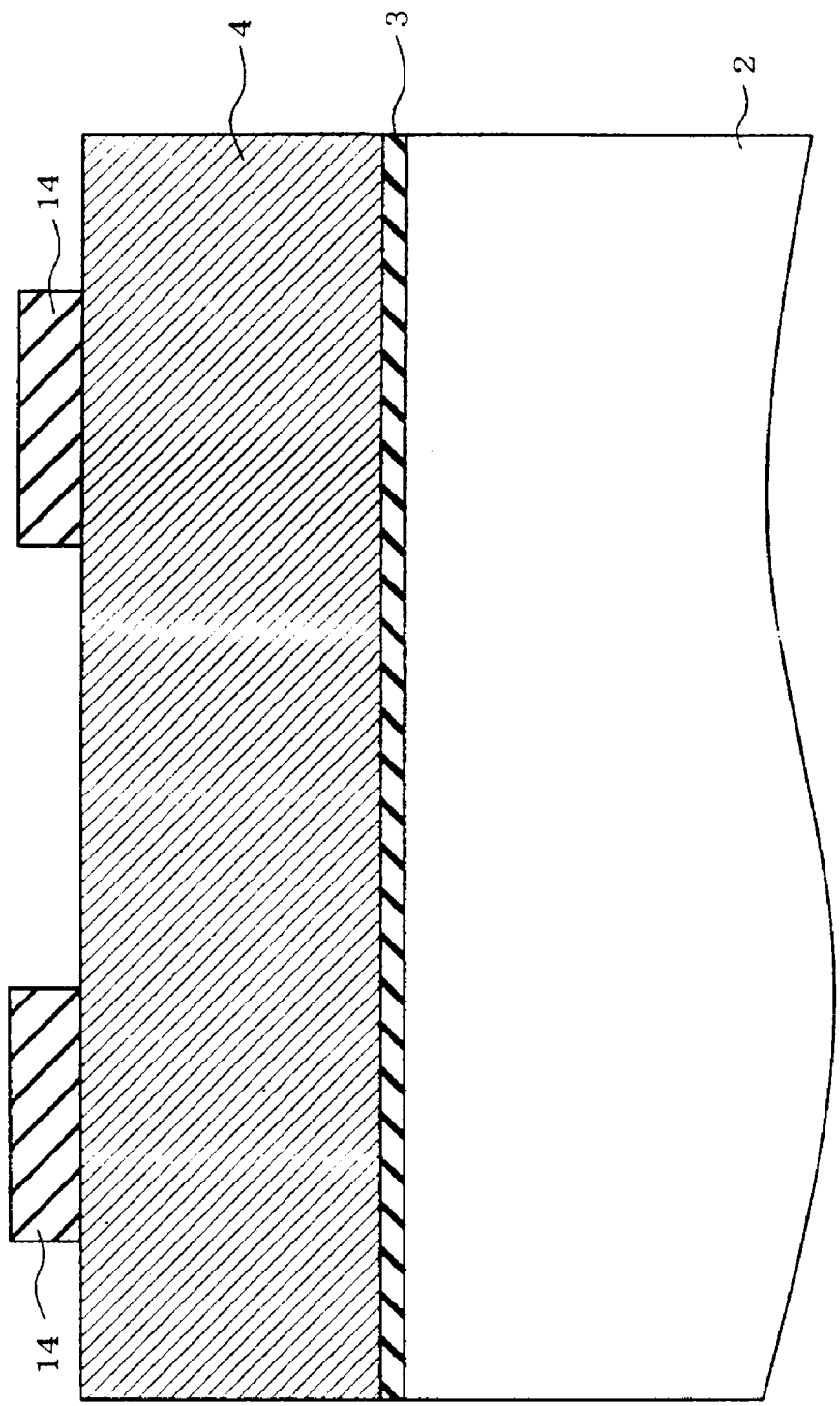

Next, referring to FIG. 6, silicon nitride film 14 is formed on the amorphous silicon layer 4 by LPCVD process in the thickness of 70 [nm] for example. Then, resist (not shown) is coated on the silicon nitride film 14 to pattern the floating gate electrode layer FG forming region, whereafter silicon nitride film 14 is removed by RIE (Reactive Ion Etching) process using the patterned resist as a mask.

Figure 7:
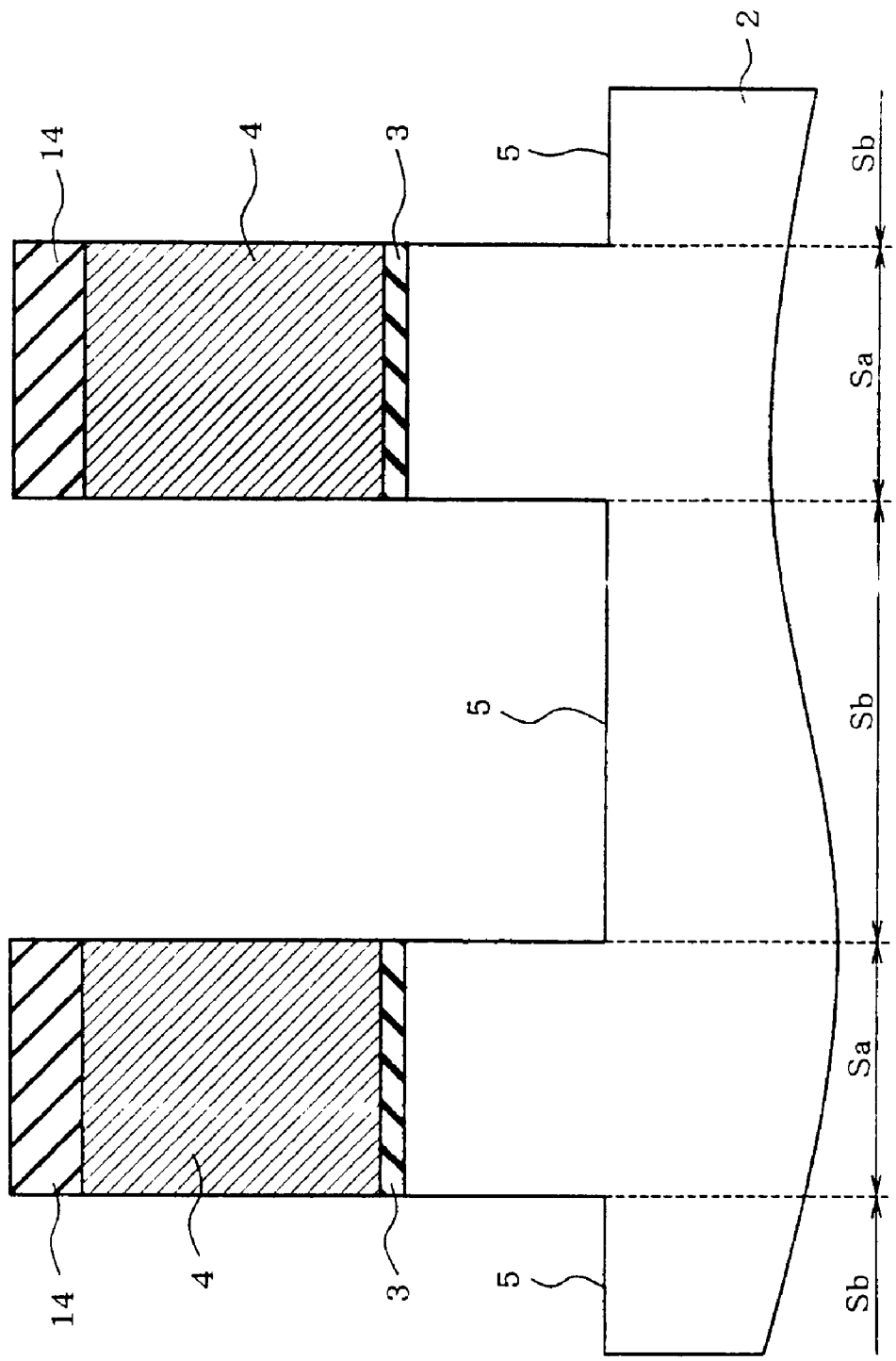

Next, referring to FIG. 7, amorphous silicon layer 4, silicon oxide film 3, and the silicon substrate 2 are etched by RIE process, and a plurality of element isolation trenches 5 are defined parallel to one another in alignment with a predetermined direction (Y-direction in FIGS. 1 and 2). The resist (not shown) is removed by ashing technique. Thus, the amorphous silicon layer 4 and silicon oxide film 3 are separated into plurality portions respectively.

Figure 8:
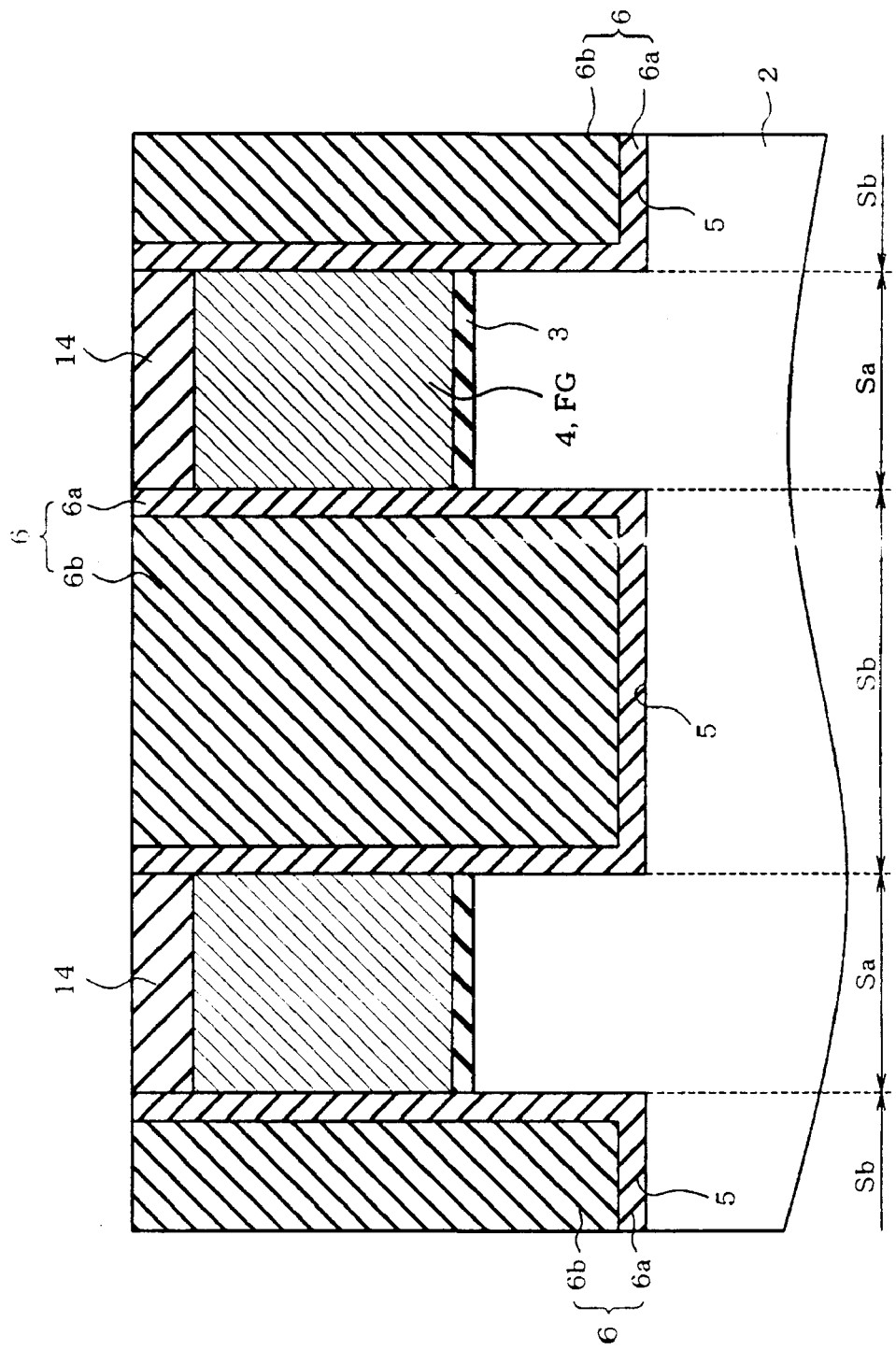

Next, referring to FIG. 8, the silicon oxide film 6a is formed along the inner surface of the element isolation trench 5 in the thickness of about 10 [nm] by LPCVD process on the aforementioned films, and polysilazane solution (a type of silica-based coating solution) is coated in the thickness of about 600 [nm] on the inner side of the silicon oxide film 6a to form the coated insulating film 6b. Then, the polysilazane solution is thermally processed in an oxidizing atmosphere at a temperature in the range of 400 to 500° C. to convert the polysilazane solution into silicon oxide film constituting the coated insulating film 6b. Thereafter, the silicon oxide film 6a and coated insulating film 6b are planarized by CMP (Chemical Mechanical Polishing) process until the surface of the silicon nitride film 14 is exposed.

Figure 9:
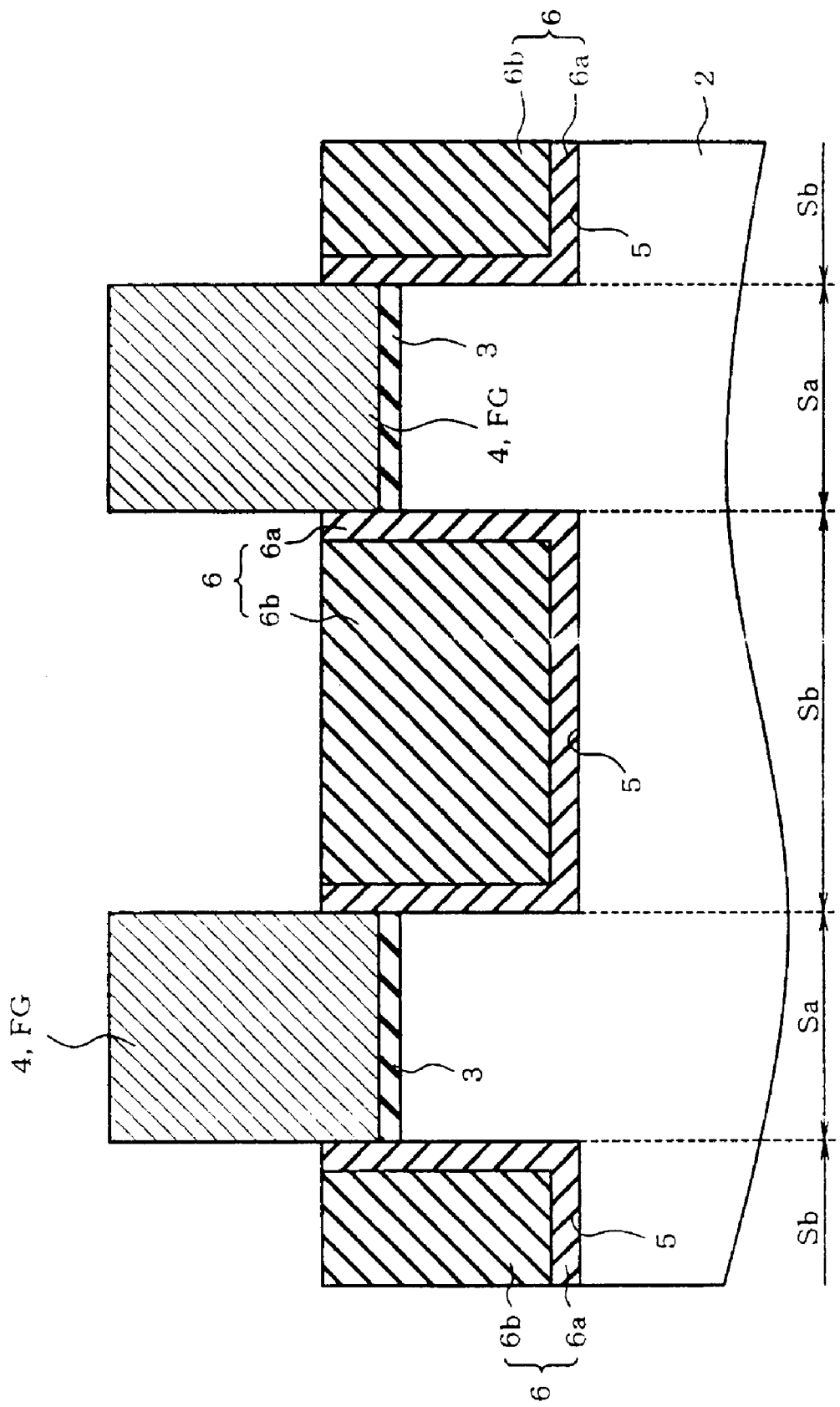

Next, referring to FIG. 9, the surfaces of the coated insulating film 6b and the silicon oxide film 6a are etched by RIE process in the magnitude of 150 [nm] for example. Then the resist (not shown) is removed by ashing technique and silicon nitride film 14 is removed thereafter. Consequently, as shown in FIG. 9, the upper surface of the coated insulating film 6b and the silicon oxide film 6a are positioned above the upper surface of the silicon oxide film 3 but below the upper surface of the amorphous silicon layer 4.

Figure 10:
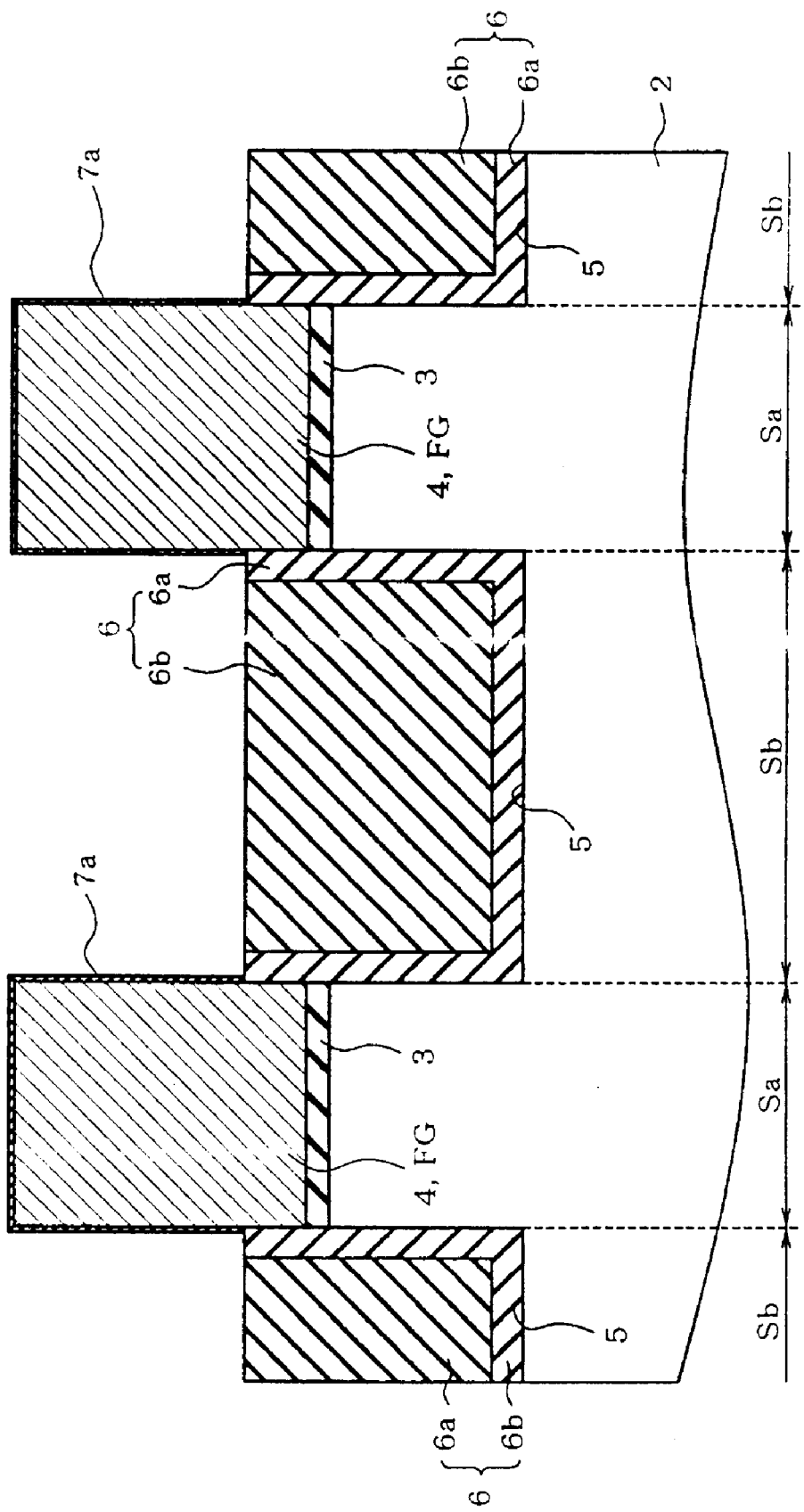

Next, referring to FIG. 10, the silicon nitride film 7a (corresponding to the nitride film layer) is selectively formed on the exposed surface of the amorphous silicon layer 4 in the thickness of 2 [nm] or less (1 [nm] for example). The silicon nitride film 7a is formed by radical nitridation treatment. Radical nitridation treatment is executed by generating micro waves in an atmosphere including nitrogen gas which radical nitridation treatment generates nitrogen radical to form the silicon nitride film 7a on the amorphous silicon layer 4.

At this time, the energy for generating plasma may be set at 2.2 eV, which is the binding energy of Si—Si bond, or greater; but less than 3.4 eV, which is the binding energy of Si—O bond, by setting the pressure in the range of 1 to 3 Torr. In such case, radical nitridation treatment being executed at an energy equivalent to or greater than the binding energy of Si—Si bond facilitates the cleavage of Si—Si bond and promotes Si—N bond on the surface of the amorphous silicon layer 4.

On the other hand, since radical nitridation treatment is executed at an energy level less than the Si—O binding energy, cleavage of the Si—O bond is disallowed in the upper surfaces of the silicon oxide film 6a and the coated insulating film 6b, consequently impairing the growth of the silicon nitride film 7a. Thus, the silicon nitride film 7a can be formed selectively on the exposed surface of the amorphous silicon layer 4.

Figure 11:
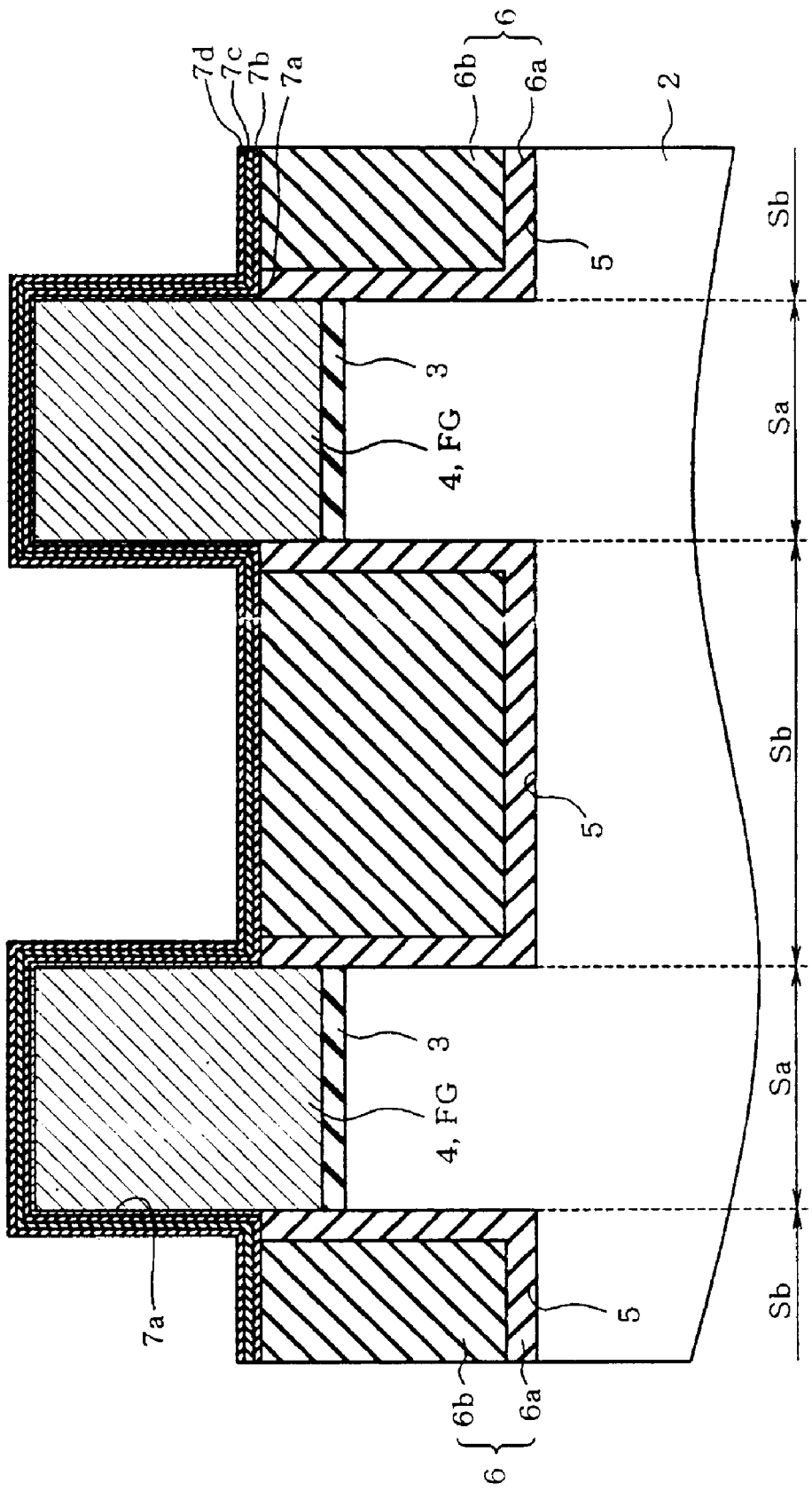

Next, referring to FIG. 11, silicon oxide film 7b, silicon nitride film 7c, and silicon oxide film 7d are formed sequentially by LPCVD process in the thickness of 6 [nm], 5 [nm] and 6 [nm] respectively.

Figure 12:
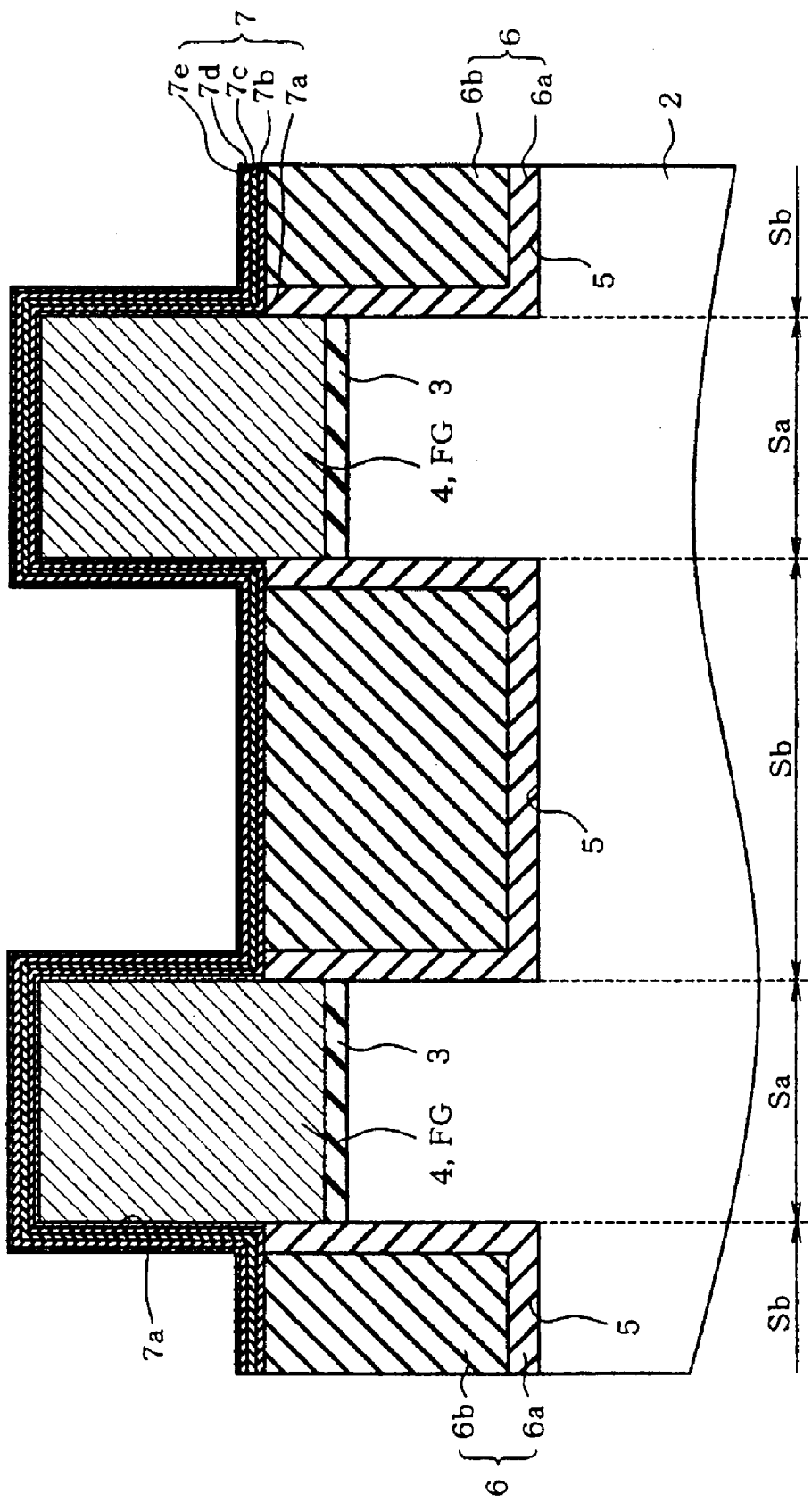

Next, referring to FIG. 12, the surface of the silicon oxide film 7d is processed by radical nitridation treatment. At this time, by setting the pressure at about 50 m Torr, the energy for generating plasma is in turn set at 3.4 eV, which is the binding energy for Si—O bond, or greater. Such setting allows cleavage of Si—O bond, thus, silicon nitride film 7e can be formed in the thickness of 1 [nm] by nitridation of the silicon oxide film 7d surface. Thus, 1 [nm] of exposed upper surface of the silicon oxide film 7d can be nitridized by radical nitridation. ONON films 7b to 7e correspond to other layers of nitride film layer (silicon nitride film 7a).

Figure 13:
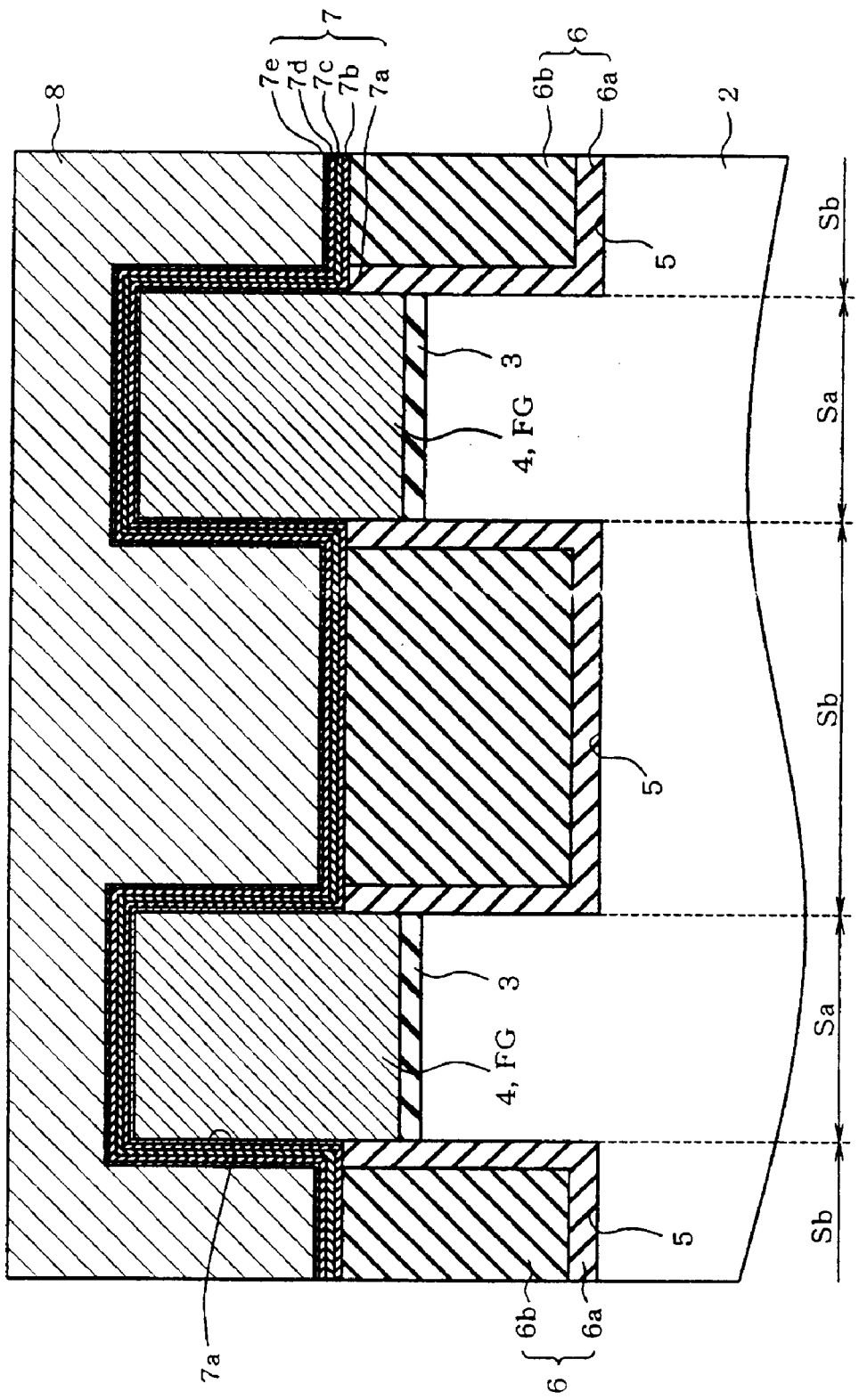

Next, referring to FIG. 13, the amorphous silicon layer 8 doped with impurities such as phosphorous or arsenic is formed by CVD process. The amorphous silicon layer 8 is later converted to polycrystalline silicon layer in the thermal oxidation step.

Next, referring to FIG. 3, tungsten silicide film 9 is formed on the polycrystalline silicon layer 8 by sputtering process, and the like, and silicon nitride film 10 is formed on the tungsten silicide film 9 by LPCVD process in the thickness of about 300 [nm]. Subsequently, a resist (not shown) is coated and thereafter patterned. Then, the stacked films 3 to 10 of the gate electrode 15 isolation region GV (refer to FIG. 2) is etched by RIE process, or the like, so as to separate the stacked films 3 to 10 in the Y-direction into plurality of portions. Thus, the stacked films 3 to 10 are allowed to remain within the plurality of Y-directional gate electrode forming regions GC (refer to FIG. 2).

Next, referring to FIG. 4, a source/drain region 2a is formed in the surface layer of the silicon substrate 2 and silicon oxide film 11 for protecting the gate is formed so as to cover the stacked layers 3 to 10. Subsequently, silicon oxide films 12 and 13 serving as interlayer insulating film are formed on the silicon oxide film 11. A bit line BL (refer to FIGS. 1 and 2 (not shown in FIGS. 3 and 4)) is formed on the interlayer insulating film and the backend process follows thereafter to render the resultant NAND flash memory device 1. A description will not be given on the backend process since it is irrelevant to the features of the present embodiment.

As described above, the manufacturing method of the present disclosure involves forming the silicon oxide film 3 and the amorphous silicon layer 4 on the semiconductor substrate 2; dividing the amorphous silicon layer 4 by forming the element isolation trench 5 in the amorphous silicon layer 4, the silicon oxide film 3 and the semiconductor substrate 2; forming an element isolation insulating film 6 in the element isolation trench 5 so as to expose the upper surface of the amorphous silicon layer 4; selectively forming the silicon nitride film 7a constituting the lowermost layer of the second gate insulating layer 7 on the exposed surface of the amorphous silicon layer 4; and forming the oxide film layer 7b constituting the second gate insulating film layer 7 on the silicon nitride film 7a and the element isolation insulating film 6, thus, no silicon nitride film is formed immediately on the element isolation insulating film 6 and charge transportation between the plurality of neighboring floating gate electrode layers FG in the X-direction can be prevented even if NONON stacked film structure is employed for the second gate insulating layer 7 formed between the floating gate electrode layer FG and control gate electrode layer CG.

In selectively forming the silicon nitride film 7a on the exposed surface of the amorphous silicon layer 4, the silicon nitride film 7a is formed by radical nitridation treatment by setting the energy for generating plasma at the binding energy of Si—Si bond or greater but less than the binding energy of Si—O. Thus, formation of silicon nitride film 7a on the exposed surface of the amorphous silicon layer 4 is promoted, whereas formation of silicon nitride film 7a on the element isolation insulating film 6 is restrained.

A manufacturing step of separating especially the lowermost layer of the NONON structure may be carried out in the same way as the manufacturing step of separating the ONO (Oxide-Nitride-Oxide) film disclosed in JP 2001-168306 A. However; employing such step may lead to cost increase since it requires an additional step for separating the nitride film layer. According to the present embodiment, since the silicon nitride film 7a of the lowermost layer of the second gate insulating film layer 7 is formed by radical nitridation, a structure that does not form the silicon nitride film 7a on the element isolation insulating film 6 can be obtained while selectively forming the silicon nitride film 7a so as to cover the floating gate electrode layer FG.

The present disclosure is not limited to the above embodiments but may be modified or expanded as follows.

Though the above embodiment employs the silicon substrate 2 as a semiconductor substrate, other types of semiconductor substrates may be employed.

In alternative to the NONON stacked film structure serving as the second gate insulating film layer 7 employed in the above embodiment, any type of stacked insulating film structure may be employed as long as it includes the NONON structure.

Instead of the silicon oxide film 6a and coated insulating film 6b serving as the element isolation insulating film 6, silicon oxide films such as LP (Low Pressure)-TEOS film or HDP (High Density Plasma)-TEOS film, TEOS-$O_3$, or the like, may be employed. LP-TEOS film is an abbreviation of a TEOS film formed by low pressure chemical vapor deposition and HDP-TEOS film is an abbreviation of a TEOS film formed by high-density plasma chemical vapor deposition. In the above described embodiment, the element isolation insulating film 6 is removed by dry-etch process, however, wet-etch may be employed alternatively.

The floating gate electrode layers FG are formed respectively on the plurality of silicon oxide films 3 in the above embodiment; however, plurality of floating gate electrode layers FG may be formed on a single continuous silicon oxide film 3.

The silicon nitride film 7a is formed by radical nitridation process in the above described embodiment, however, it may be formed by LPCVD with $SiCl_2H_2$ and $NH_3$ as gas source at 700° C. or less instead.

The present disclosure is applied to the NAND flash memory device 1, however the present disclosure may be applied to other non-volatile semiconductor storage devices as required such as EEPROM, EPROM and NOR type, or other non-volatile semiconductor storage device, semiconductor storage device and semiconductor device.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
    a semiconductor substrate;
    a first gate insulating film formed on the semiconductor substrate;
    a first gate electrode layer formed on the first gate insulating film;
    an element isolation insulating film formed so as to isolate a plurality of the first gate electrode layers;
    a second gate insulating film layer formed so as to cover upper surfaces of the plurality of first gate electrode layers and the element isolation insulating films; and
    a second gate electrode layer formed on the second gate insulating film layer,
    wherein the second gate insulating film layer includes a NONON stacked film structure and a nitride film layer contacting the first gate electrode layer and constituting a lowermost layer of the NONON stack film structure is separated at a portion interposing the plurality of neighboring first gate electrode layers, and
    wherein the second gate insulating film layer includes a structure where an oxide film layer and a nitride film layer of the NONON stacked film structure are formed sequentially on the element isolation insulating film, and the oxide film layer is formed thicker than the nitride film layer.

2. The device of claim 1, wherein the second gate insulating film layer includes a structure where an oxide film layer is formed to cover an entire upper surface of the element isolation insulating film.

3. A method of manufacturing a semiconductor device, comprising:
    forming a first gate insulating film and a first conductive layer on a semiconductor substrate;
    separating the first conductive layer by forming an element isolation trench in the first conductive layer, the first gate insulating film and the semiconductor substrate;
    forming an element isolation insulating film in the element isolation trench so as to provide a first exposed surface on at least a portion of the first conductive layer and a second exposed surface on the element isolation insulating film;
    selectively forming a nitride film layer constituting a lowermost layer of a second gate insulating film layer on the exposed surface of the first conductive layer except the second exposed surface while selectively excluding formation of said nitride film layer on said second exposed surface except for outer edges of said second exposed surface; and
    forming an oxide film layer constituting the second gate insulating film layer on the nitride film layer and the element isolation insulating film.

4. The method of claim 3, wherein a silicon nitride film serving as the nitride film layer is selectively formed on the exposed surface of the first conductive layer by a radical nitridation treatment by specifying a plasma-generating energy equal to or greater than Si—Si binding energy but less than a Si—O binding energy.

5. A method of manufacturing a semiconductor device including a semiconductor substrate including a pair of active areas, each active area having a first upper surface, respectively, an element isolation insulating film separating the active areas, the element isolation insulating film including a second upper surface being higher than the first upper surface, gate insulating films formed on the active areas, and a plurality of floating gate electrodes formed on the gate insulating films, each floating gate electrode including a third upper surface being higher than the second upper surface of the element isolation insulating film relative to the first upper surface of the active area, a lower side surface facing a side surface of the element isolation insulating film and an upper side surface located above the lower side surface without facing the side surface of the element isolation insulating film, comprising:
    forming an inter-gate insulating film on the floating gate electrodes and the element isolation insulating film, including
    executing a first radical nitridation treatment to the third upper and upper side surfaces of the floating gate electrodes and the second upper surface of the element isolation insulating film by a first pressure so as to selectively form a first silicon nitride film having a first thickness on the third upper and upper side surfaces of the floating gate electrodes without forming the first silicon nitride film on the second upper surface of the element isolation insulating film,
    forming a first silicon oxide film on the first silicon nitride film and the second upper surface of the element isolation insulating film,
    forming a second silicon nitride film on the first silicon oxide film,
    forming a second silicon oxide film on the second silicon nitride film, and
    executing a second radical nitridation treatment to the second silicon oxide film by a second pressure being less than the first pressure so that a third silicon nitride film is formed on the second silicon oxide film, and
    forming a control gate electrode on the third silicon nitride film of the inter-gate insulating film.

6. The method of claim 5, wherein the first and second silicon oxide films and the second silicon nitride film are formed by a low pressure chemical vapor deposition process.

7. The method of claim 5, wherein a thickness of the first silicon oxide film above the element isolation insulating film is greater than a thickness of the second silicon nitride film.

8. The method of claim 5, wherein the first radical nitridation treatment executes by a plasma-generating energy equal to greater than a Si-Si binding energy but less than a Si-O binding energy.

9. The method of claim 5, wherein the first radical nitridation treatment executes by a plasma-generating energy equal to greater than a Si-Si binding energy and a Si-O binding energy.

* * * * *